(12) United States Patent
Okabe et al.

(10) Patent No.: US 6,338,604 B1
(45) Date of Patent: Jan. 15, 2002

(54) LID LATCH MECHANISM FOR CLEAN BOX

(75) Inventors: Tsutomu Okabe; Hiroshi Igarashi, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/559,072

(22) Filed: Apr. 27, 2000

(30) Foreign Application Priority Data

Aug. 11, 1999 (JP) .............................................. 11-227118

(51) Int. Cl.⁷ ................................................ B65D 85/90
(52) U.S. Cl. .................... 414/217.1; 414/217; 414/937; 414/938; 414/939
(58) Field of Search ............................. 414/217, 217.1, 414/411, 414, 937, 938, 939

(56) References Cited

U.S. PATENT DOCUMENTS

| | | | |
|---|---|---|---|
| 4,684,021 A | * 8/1987 | Niebling et al. | 205/334 X |
| 4,838,990 A | * 6/1989 | Jucha et al. | 156/643 X |
| 5,139,459 A | 8/1992 | Takahashi et al. | |
| 5,364,219 A | 11/1994 | Takahashi et al. | |
| 5,834,915 A | * 11/1998 | Babbs et al. | 318/282 X |
| 6,186,331 B1 | * 2/2001 | Kinpara | 206/711 X |

FOREIGN PATENT DOCUMENTS

| | | |
|---|---|---|
| JP | 63-28047 | 2/1988 |
| JP | 2137951 | 11/1994 |
| JP | 2525284 | 5/1996 |
| JP | 9-246351 | 9/1997 |
| JP | 2722306 | 11/1997 |
| JP | 10-56050 | 2/1998 |
| JP | 2757102 | 3/1998 |
| JP | 2850279 | 11/1998 |
| JP | 10-321695 | 12/1998 |

* cited by examiner

Primary Examiner—Christopher P. Ellis
Assistant Examiner—Kenneth W Bower
(74) Attorney, Agent, or Firm—Oblon, Spivak, McClelland, Maier & Neustadt, P.C.

(57) ABSTRACT

A latch mechanism for latching a lid of a clean box having a box body opening at one surface and a lid for closing the opening includes a latch member pivotal about a shaft mounted on the box body, a latch engagement portion provided on the lid for engaging with the latch member in its predetermined pivotal position, and a biasing member for biasing the latch member toward the latch engagement portion. A guide surface is provided in a portion, facing outwardly, of the opening of the box body of the latch member. When the clean box is installed on a load port, the guide surface is brought into a pressing contact with the latch guide provided in the load port so that the latch member pivots to release the latch of the lid.

11 Claims, 7 Drawing Sheets

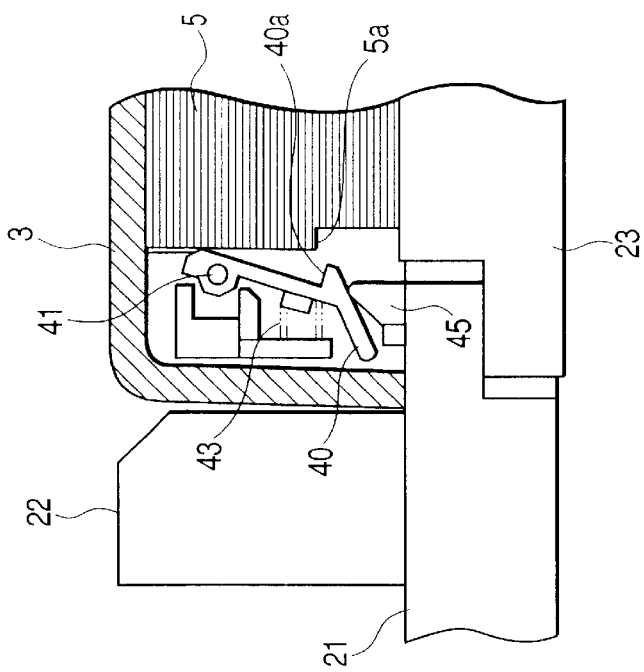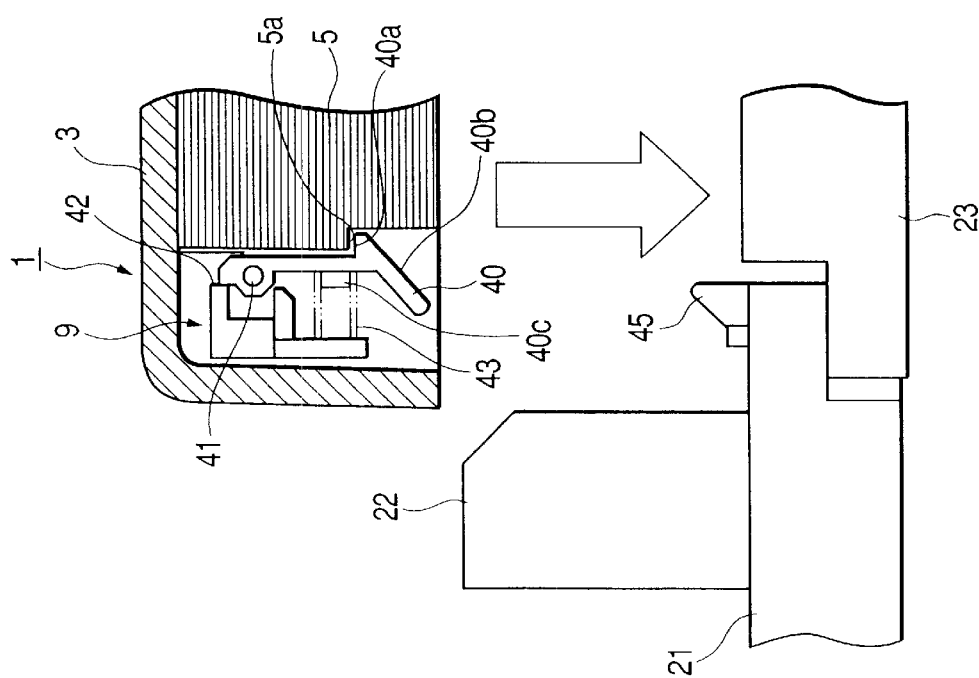

LID LATCH MECHANISM FOR CLEAN BOX

BACKGROUND OF THE INVENTION

1. Field of the Invention

The present invention relates to a lid latch mechanism for a clean box for transferring and reserving various articles to be processed such as semiconductor wafers in a clean condition in a process for manufacturing semiconductors, electronic part related products, optical discs or the like.

2. Related Background Art

Recently, in a manufacturing process that requires a high level clean environment such as a semiconductor device manufacturing process, a method such as a mini-environment or a local clean space where an entire factory is not kept clean but only the ambient environment for products is kept under a clean condition has been adopted. In brief, only the interior of the respective processing apparatus is kept clean, which is used in the manufacturing process, and the transfer and reservation of the articles to be processed between the respective processing apparatus (clean apparatus) are performed by using containers (i.e., clean boxes) whose interior is kept clean.

The clean box is a substantially rectangular box body opened at one surface, and has a plate-like door (i.e., lid) for closing the opening. In the case where the article to be processed such as a semiconductor wafer received in the clean box is loaded into a processing apparatus, the loading operation is performed through an additional device called a load port, mounted on the processing apparatus. The load port is a device mounted on the processing apparatus for opening and closing the lid of the clean box while keeping the clean box and the interior of the processing apparatus under the clean condition and for making it possible to transfer the article to be processed such as a semiconductor wafer housed in the clean box into the interior of the processing apparatus. The load port is sometimes called an opener because it opens the lid of the clean box.

The clean boxes are categorized into two types in accordance with the types of the associated load ports, i.e., a bottom down type which is opened at the bottom surface, for taking out the housed article in the downward direction of the box and a side open type which is opened at a side surface of the clean box for taking out the housed article in the sideway.

An example of the bottom down type clean box is shown in FIGS. 1A and 1B. FIG. 1A is a side elevational cross-sectional view of the clean box and FIG. 1B is a plan view of the lid (door).

As shown in FIG. 1A, a clean box 100 is composed of a substantially square-shaped box body 101 opened at one side surface (a bottom surface in case of the bottom down type clean box shown in FIGS. 1A and 1B) and a lid 102 for closing the opening of the box body 101. A shelf-like carrier 103 for holding the stacked semiconductor wafers to be received in the box at an equal interval is fixed above the lid 102 in the example shown in FIGS. 1A and 1B. A flange portion 101a expanded outwardly is provided around the bottom surface opening of the box body 101 into which the lid 102 is inserted/engaged.

An annular groove 110 for vacuum suction is formed in a circumferential edge portion of the surface (upper surface) facing the box body 101 of the lid 102 in the example shown in FIGS. 1A and 1B. O-rings used as elastic seal members are mounted along the inside and the outside of the annular groove 110 along the annular groove 110, respectively.

Under the condition that the lid 102 closes the opening of the clean box body 101 in FIG. 2, the suction space formed by the annular groove 110 and the flanged portion 101a of the box body 101, i.e., a space of an interior of the annular groove 110 closed at its upper portion by the flanged portion 101a of the box body 101 is evacuated to thereby suck the lid 102 to the box body 101. The evacuation is performed from the back side of the lid by a means (not shown) through a gas passage 112 provided in communication with the annular groove 110. For instance, the vacuum suction method using such a suction groove is described in Japanese Patent Application Laid-Open No. 10-321696.

In such type clean box, there is provided a mechanical latch for preventing the falling off of the lid since there is a fear that the lid would be fallen off in the case where the vacuum suction is broken down due to leakage at the seal portion or the like.

Also, in a conventional clean box where the above-described vacuum suction groove is not provided, a seal member such as an O-ring is mounted so as to surround the opening of the box on the lid 102 or the box body flange portion 101a. Also in this case, although the latch mechanism for latching the lid to the box body is provided, the function of the latch mechanism is not only to prevent the lid from falling off but also to fix the lid to the body under the sealed condition by depressing the lid to the box body and deforming the seal member (O-ring) between the box body and the lid.

An example of the conventional lid latch mechanism to be used for both the clean box provided with the above-described vacuum suction annular groove and the clean box provided with no annular groove is shown in FIG. 2. FIG. 2 is a bottom view of the lid of the clean box 100 shown in FIGS. 1A and 1B.

The latch mechanism has a circular rotary cam plate 201 provided rotatably substantially at a center of the interior of the lid 102. Two cam grooves 201a and 201b are formed in the rotary cam plate 201. The latch mechanism also has slidable latch members 203 and 204. The latch members 203 and 204 are slidable up and down under the guidance of guide members 206 and 207. Cam pins 205 and 206 are implanted in the latch members 203 and 204, respectively, and the cam pins 205 and 206 are engaged with the cam grooves 201a and 201b of the rotary cam plate 201, respectively.

As shown in FIG. 2, the respective cam grooves 201a and 201b are formed into a shape such that a distance from the center of the rotary cam plate 201 is changed depending on the circumferential position thereof. The latch members 203 and 204 are moved up and down in FIG. 2 in response to the clockwise and counterclockwise rotation of the rotary cam plate 201 in accordance with the cam shape. Thus, in response to the rotational position of the rotary cam plate 201, the respective tip end portions 203a and 204a may take positions retracted and projected with respect to the circumference of the lid 102.

In the case where the lid is mounted on the clean box body 101, when the rotary cam plate 201 is rotated in the counterclockwise direction of FIG. 2 so that the tip end portions 203a and 204a of the latch members are projected from the circumference of the lid 102, the tip end portions are engaged with tabs or holes (not shown) formed in the clean box body 101 to thereby latch the lid 102 to the clean box body 101. Inversely, when the rotary cam plate 201 is fully rotated clockwise, the latch members 203 and 204 are slid to the innermost position indicated by two-dot-and-dash lines in FIG. 2. In this case, the tip end portions 203a and 204a of the latch members are retracted from the circumference of the lid to thereby release the engagement with the clean box body.

A latch drive portion 209 is provided at the center of the rotary cam plate 201 for rotatably driving the cam plate 201. A pair of circumferential holes 201c are formed in the latch drive portion 209.

A mechanism for opening/closing the above-described latch is provided in the load port for transferring the article to be processed within the clean box to the processing apparatus. A latch opening/closing mechanism having two pins that engage with the circumferential holes 201c of the above-described latch drive portion 209 of the latch mechanism is provided in the load port table on which the clean box 100 is laid on the load port. The pins are driven to rotate the latch drive portion 209 to thereby open/close the latch of the clean box lid 102.

The above-described conventional lid latch mechanism has the following disadvantage. First of all, the mechanism is complicated and needs a large number of mechanical parts. Accordingly, the cost is increased, and on the other hand, the possibility of breakdown is increased so that the operation would frequently be discontinued. Also, when the latch mechanism is to be closed and opened, a mechanism for opening/closing using a power of a motor, an actuator or the like is required (the latch opening/closing mechanism provided in the load port in the above-described conventional example). Also, this requires the increased cost and increases the possibility of breakdown due to its complicated structure.

Accordingly, there is a high demand to latch the lid to the clean box with a simpler mechanism.

SUMMARY OF THE INVENTION

An object of the present invention is to provide a lid latch mechanism for a clean box, which has a simple structure for solving the above-noted defects. According to the present invention, there is provided a lid latch mechanism for latching a lid of a clean box having a box body opening at one surface and the lid for closing the opening, comprising: a latch member that is mounted on the box body and pivotal about a single shaft; a latch engagement portion provided on the lid for engaging the latch member in its predetermined pivotal position; and a biasing member for biasing the latch member toward the latch engagement portion, wherein a guide surface is provided on a portion, facing the outside of the opening of the box body of the latch member, and when the clean box is set on a load port, the guide surface is brought into contact with and pressed by a latch guide provided on the load port so that the latch member pivots to thereby release the latch of the lid.

Also, according to the present invention, there is provided a lid latch system for a clean box in a clean transfer system composed of the clean box having a box body opening at one surface and a lid for closing the opening and a load port for opening the clean box and loading into a clean apparatus an article to be transferred within the clean box, comprising: a clean box latch mechanism including a latch member that is mounted on the box body and pivotal about a single shaft, a latch engagement portion provided on the lid for engaging the latch member kept in a predetermined pivotal position, and a biasing member for biasing the latch member toward the latch engagement portion; and a latch guide mechanism as a projection provided on the load port, wherein when the clean box is set on the load port, the latch member is brought into contact with and pressed by the latch guide mechanism so that the latch member pivots to release the latch of the lid.

In the lid latch mechanism for the clean box and the lid latch system according to the present invention, it is possible to use a structure in which upon dismounting the clean box from the load port, the pressure of the latch mechanism by the latch guide on the load port is released, and then the latch member is forced by the biasing member to pivot to thereby engage with the latch engagement portion of the lid so that the lid is automatically latched.

It is preferable that the latch mechanism be provided in each of two opposite sides of the opening of the box body.

In the lid latch mechanism for the clean box and the lid latch system according to the present invention, it is preferable to use a lid latch mechanism for such a type clean box that the clean box has an annular groove formed so as to surround the opening in at least one of the box body and the lid, so that a vacuum suction annular space is formed between the box body and the lid in a condition where the lid closes the opening of the box body.

BRIEF DESCRIPTION OF THE DRAWINGS

FIG. 1A is a side elevational cross-sectional view of the clean box and FIG. 1B is a plan view of a lid;

FIGS. 6A and 6B are side elevational cross-sectional view showing the operation of the lid latch mechanism when the clean box is set on the load port;

FIG. 8A is a side elevational view (partially in cross-section), and FIG. 8B is a frontal view as viewed from the opening.

DESCRIPTION OF THE PREFERRED EMBODIMENTS

Embodiments of the present invention will now be described with reference to the accompanying drawings.

Figure 1A:
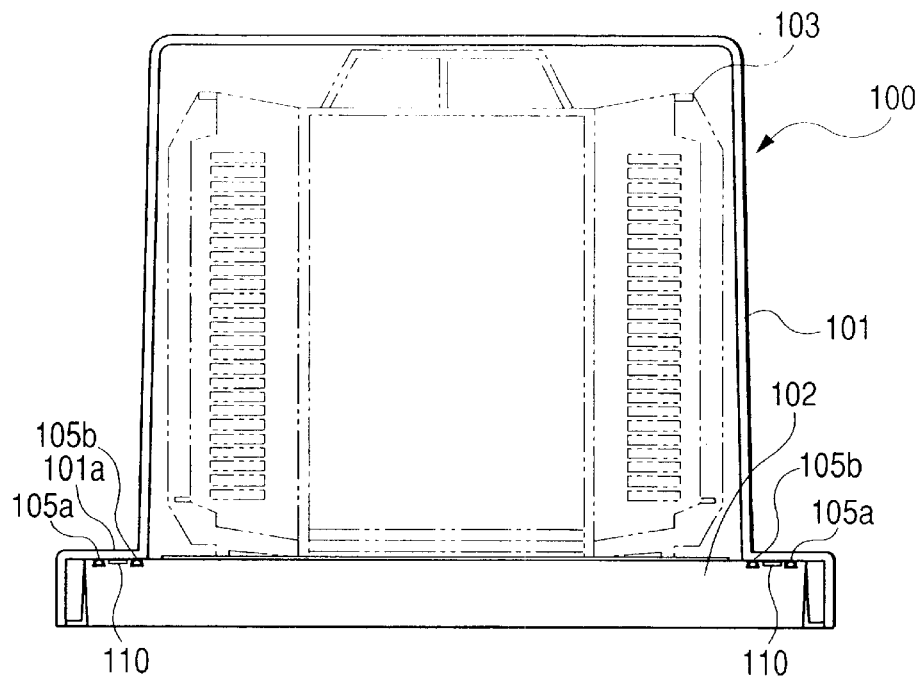
FIGS. 1A and 1B are views showing a clean box having a vacuum suction annular groove.
Figure 1B:
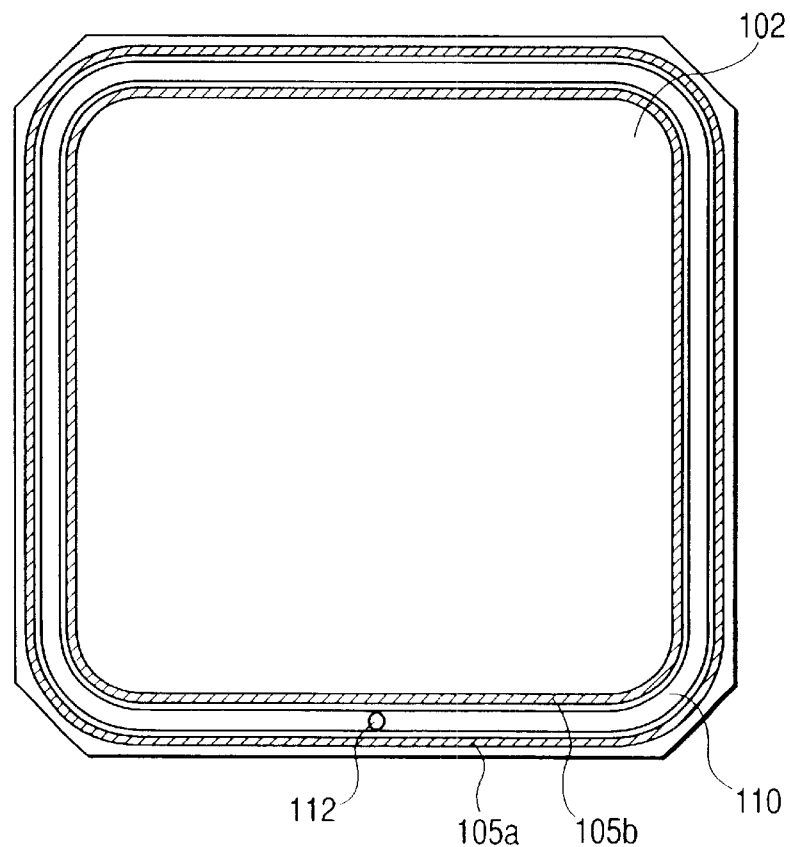
Figure 2:
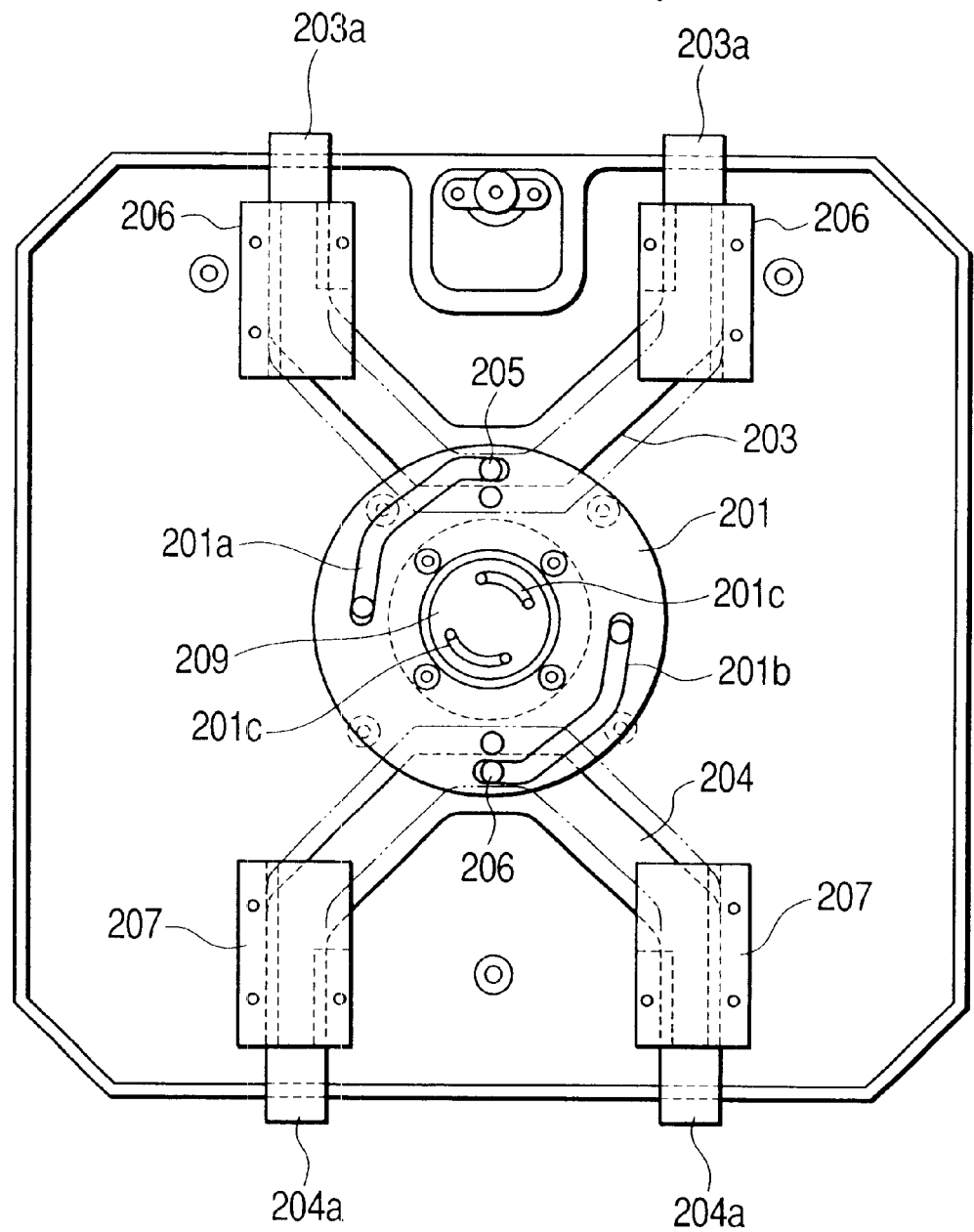
FIG. 2 is a view showing a conventional lid latch mechanism.
Figure 3:
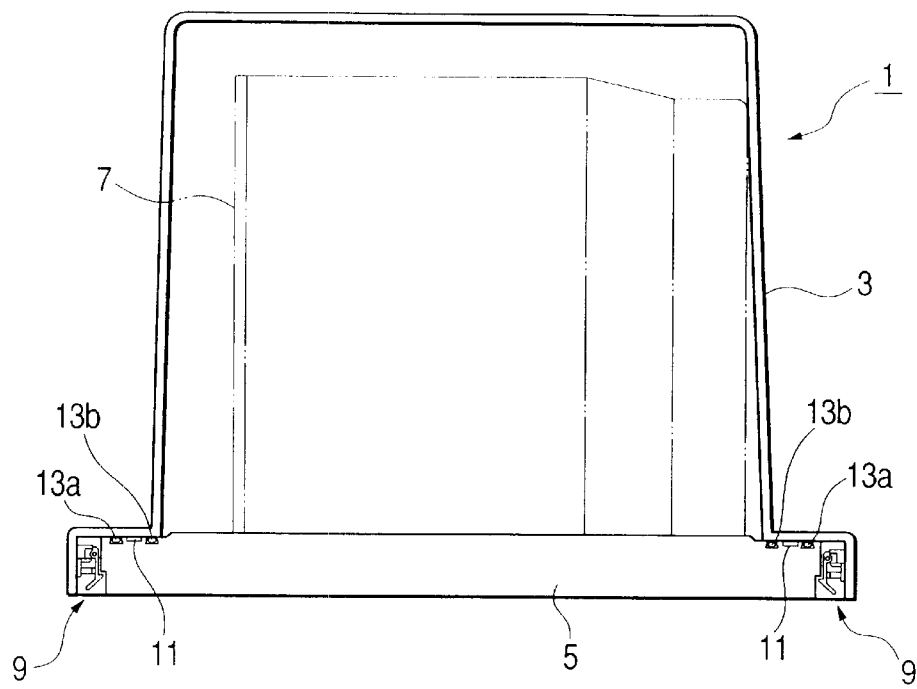
FIG. 3 is a side elevational cross-sectional view showing a clean box (bottom down type) having a lid latch mechanism according to an embodiment of the present invention.
Figure 4:
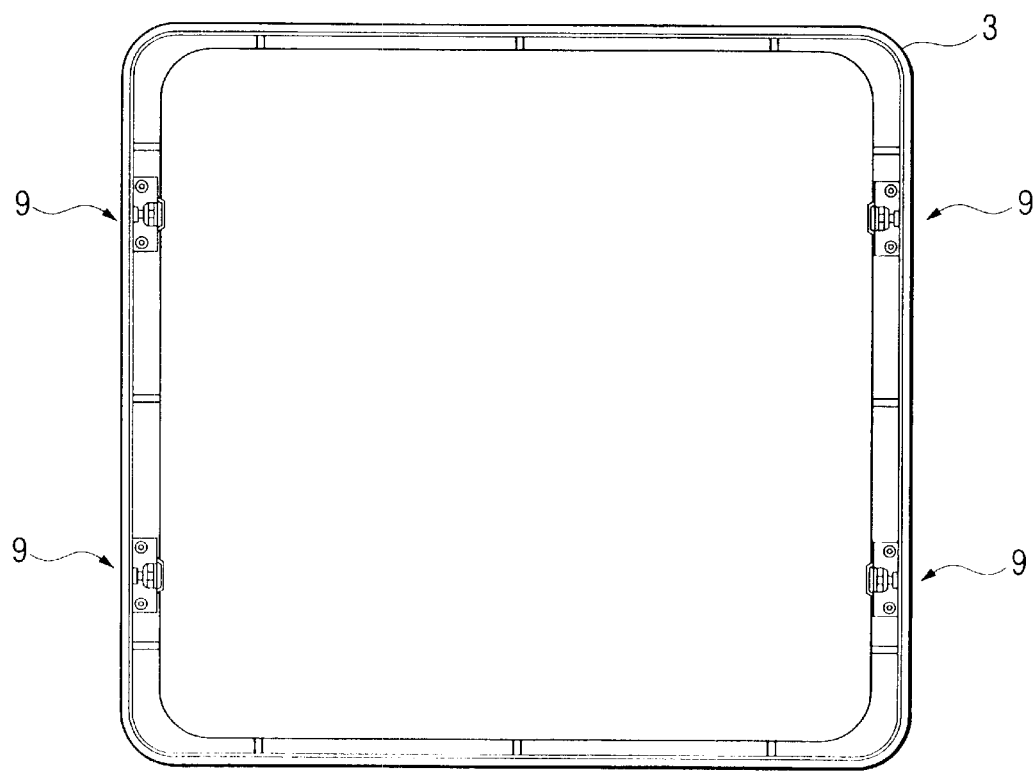
FIG. 4 is a bottom view showing the clean box shown in FIG. 3.

FIGS. 3 and 4 are views showing a clean box provided with a lid latch mechanism according to the present invention. FIG. 3 is a side elevational cross-sectional view showing the clean box and FIG. 4 is a bottom view showing the clean box body. A clean box 1 according to the embodiment shown in FIG. 3 is a clean box for transferring and keeping semiconductor wafers in a semiconductor device manufacturing process. This clean box 1 has a substantially square-shaped clean box body 3 opened at a bottom surface and a lid 5 for closing the lower opening of the clean box body 3 in the same manner as in the conventional clean box shown in FIGS. 1A and 1B. A periphery of the opening bottom surface of the clean box body 3 expands outwardly to form a flange. A carrier 7 for holding a plurality of semiconductor wafers substantially at an equal interval in parallel with each other is fixed to the top surface of the lid 5.

An annular groove 11 is formed so as to surround the opening of the box body 3 in the periphery of the top surface of the lid 5. The annular groove 11 cooperates with O-rings 13a and 13b provided in the inside and the outside thereof to form an annular suction space for vacuum suction between the lid 5 and the clean box body 3. The function of the suction space is the same as that of the conventional clean box described in conjunction with FIGS. 1A and 1B and therefore the explanation thereof will be omitted.

A plurality of latch mechanisms 9 for latching the lid 5 are provided at the outermost peripheral portion of the flanged portion of the clean box body 3. As is apparent from FIG. 4, the clean box according to this embodiment has, in total, four latch mechanisms 9 two of which are provided in each of the two opposite sides of the bottom surface opening of the clean box body 3. The latch mechanisms will be described in detail later.

Figure 5:
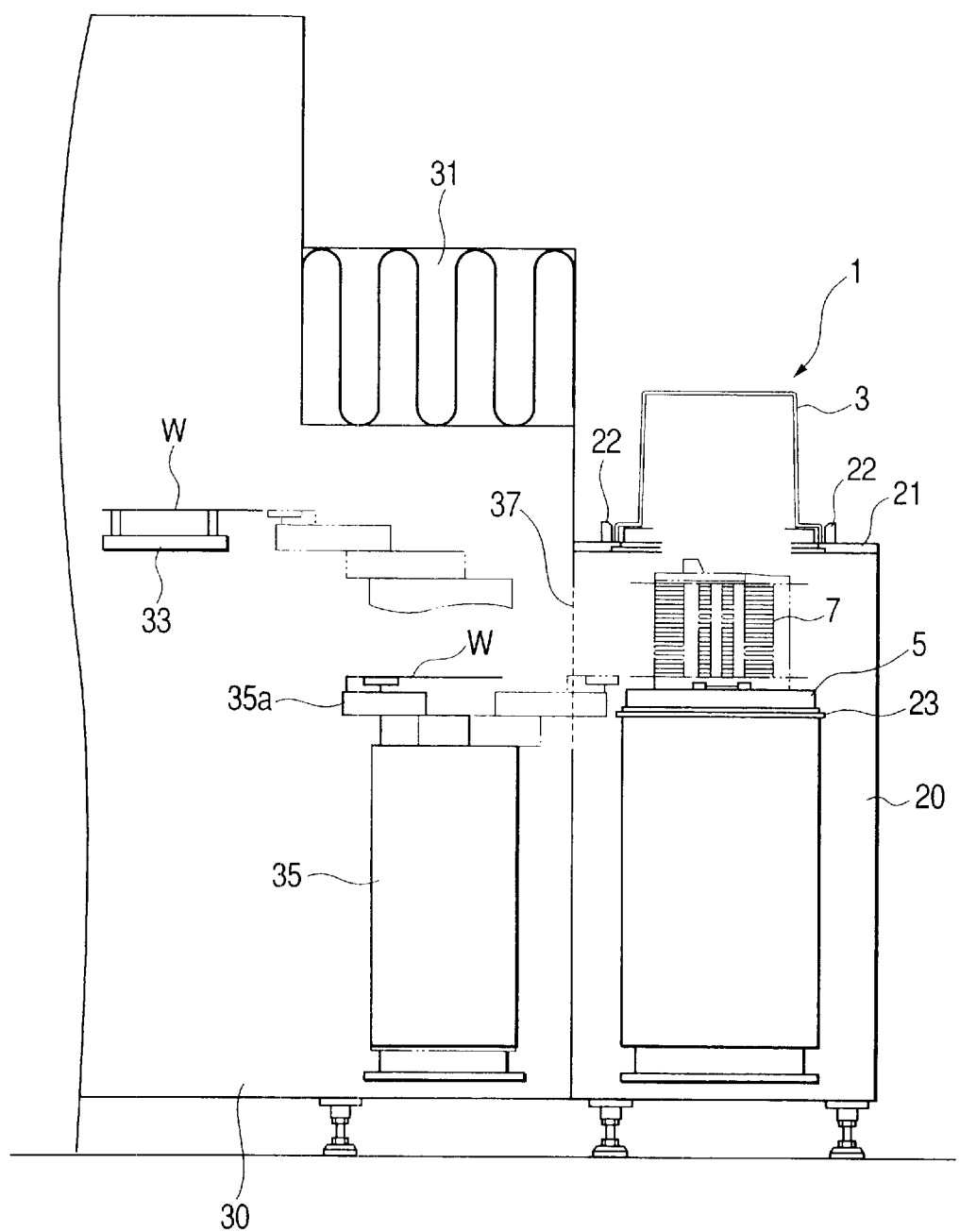
FIG. 5 is a schematic view showing a state in which the clean box is set on a load port of a semiconductor device manufacturing apparatus.

A load port that is a device for opening the clean box and loading semiconductor wafers within the clean box into the processing apparatus will now be described. FIG. 5 is a schematic view showing the semiconductor processing apparatus and the load port related thereto and the clean box set on the load port.

A load port 20 is mounted depending upon a semiconductor processing apparatus 30. The clean box 1 that has been transferred by a transfer system such as an overhead transfer (OHT) is set on a load port table 21 on the top surface of the load port 20. Clean box guides 22 for positioning the clean box 1 in place on the table are provided on the load port table 21. The load port 20 has an elevator type lid opening/closing mechanism 23 for opening the lid 5 of the clean box 1 downwardly and retracting it into the load port 20. By the lid opening/closing mechanism 23, a wafer W on the carrier 7 retracted downwardly together with the lid 5 as shown in FIG. 5 is transferred by an arm 35a of a transfer robot 35 to a processing stage 33 of the processing apparatus 30 where the wafer is subjected to a necessary process. Thereafter the wafer is returned back to the carrier by the transfer robot.

A local clean space is formed by an interior space including the load port 20, the wafer processing apparatus 30 and the clean box 1 under the condition shown in FIG. 5. In order to keep the space clean, a fan suction device 31 having a filter is provided in the upper portion of the apparatus 30. A downward gas flow is generated in the apparatus by the fan suction device 31 to thereby lower the dust within the apparatus to keep the space within the apparatus 30 clean. The downward flow is discharged from the bottom surface of the apparatus to the outside.

Referring now to FIGS. 6A and 6B, the latch mechanism for the clean box and the related mechanism on the side of the load port will be described. FIGS. 6A and 6B are cross-sectional views showing the latch mechanism portion of the clean box and the related load port upper portion together. The latch mechanism is mainly composed of a latch member 40 mounted pivotally around a shaft 41, a coiled spring 43 for pivoting the latch member in the right direction in the drawings, i.e., in the counterclockwise direction, and a stop 42 for limiting the pivotal motion of the latch member. The coiled spring 43 is mounted around a cylindrical projection 40c provided on the latch member 40.

FIG. 6A shows a state just before the clean box has been lowered onto the load port. In this state, the lid 5 closes the opening of the clean box. Also, a hook portion 40a of the latch member 40 engages with a shoulder portion (i.e., stepped portion) 5a of a recess formed in the lid to latch the lid. Under this condition, the latch member 40 is biased in the counterclockwise around the shaft 41 by the coiled spring 43 and is kept in abutment with the stop 42 in the status shown in the drawing. Thereafter the clean box 1 is lowered while being guided by the clean box guides 22 and is positioned and laid at a predetermined position on the load port table 21. When the clean box is guided by the clean box guides 22 to take a correct position, the latch member 40 of the latch mechanism 9 is in alignment with the projected latch guide 45 provided on the load port table 21.

As is apparent from FIG. 6A, the bottom surface of the latch member 40 has a portion 40b that forms a slant surface. When the clean box 1 is to be loaded on the load port table 21 and the clean box is lowered while being guided by the clean box guides 22, the latch guide 45 on the load port table 21 is brought into abutment with the slant portion 40b of the latch member 40. Thus, the slant portion 40b is subjected to the force in the left side of FIG. 6A so that the latch member 40 pivots clockwise about the shaft 41 to disengage the hook portion 40a of the latch member 40 from the shoulder portion 5a of the lid 5. Namely, when the clean box is seated on the load port, the state shown in FIG. 6B is taken. In this case, since the latch of the lid by the latch mechanism 9 is released, if the vacuum suction between the lid 5 and the clean box body 3 is released by a mechanism (not shown), the lid may be opened.

Figure 7:
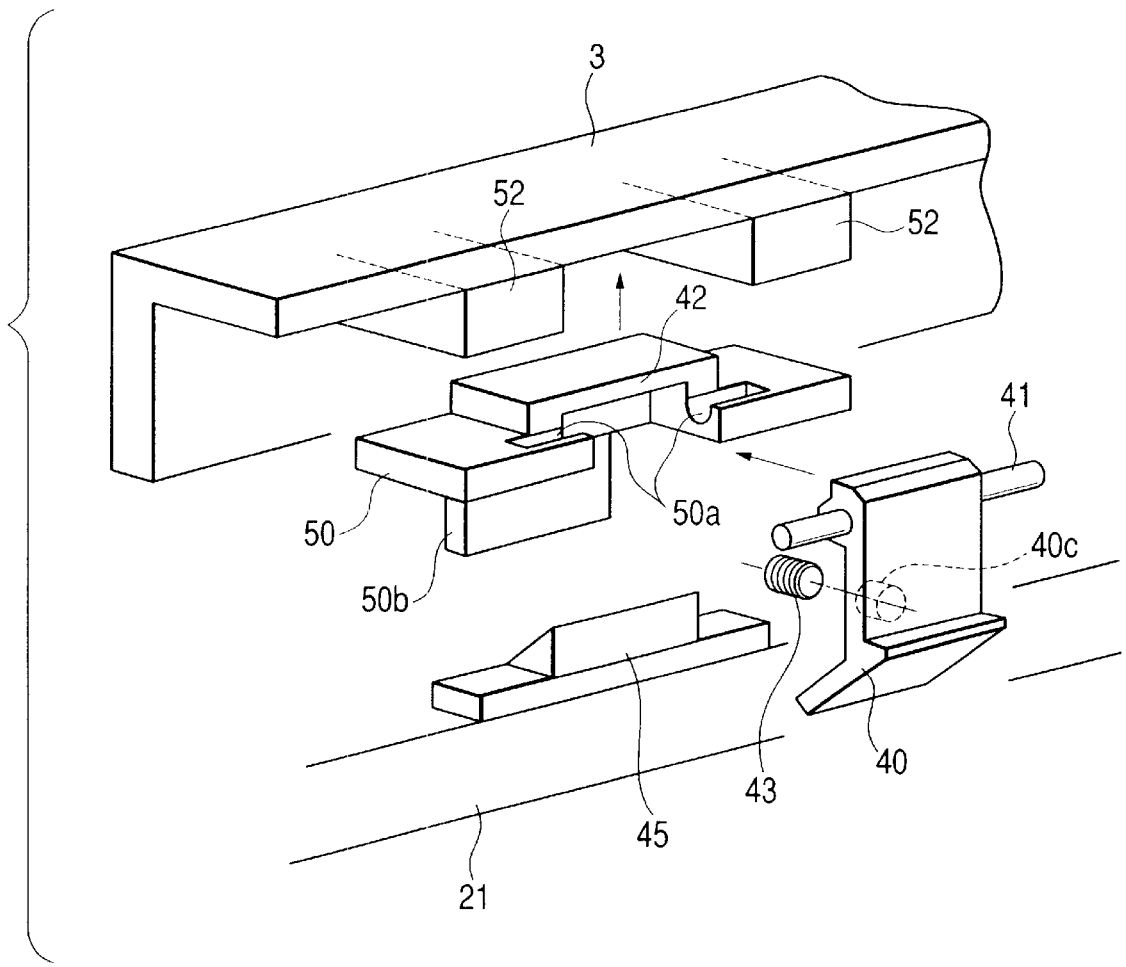
FIG. 7 is an exploded perspective view illustrative of the detail of the structure of the lid latch mechanism.

The latch mechanism 9 will now be described in more detail with reference to FIG. 7 which is an exploded perspective view showing one latch mechanism. The clean box according to this embodiment has four latch mechanisms 9 in total but each latch mechanism is the same in structure. The shaft 41 of the latch member 40 is placed on a groove 50a of a bearing member 50 and the bearing member 50 is mounted by bonding or screw fastening to a bearing bases 52 fixed to the inner surface of the flanged portion of the clean box body 3 to thereby form the latch mechanism. In this case, the coiled spring 43 is mounted around the projection 40c of the latch member 40 to work between a back plate 50b of the bearing member 50 and the latch member 40. As has been apparent from the foregoing description, the latch mechanism according to the present invention may be very simply manufactured with a small number of mechanical parts.

Figure 8A:
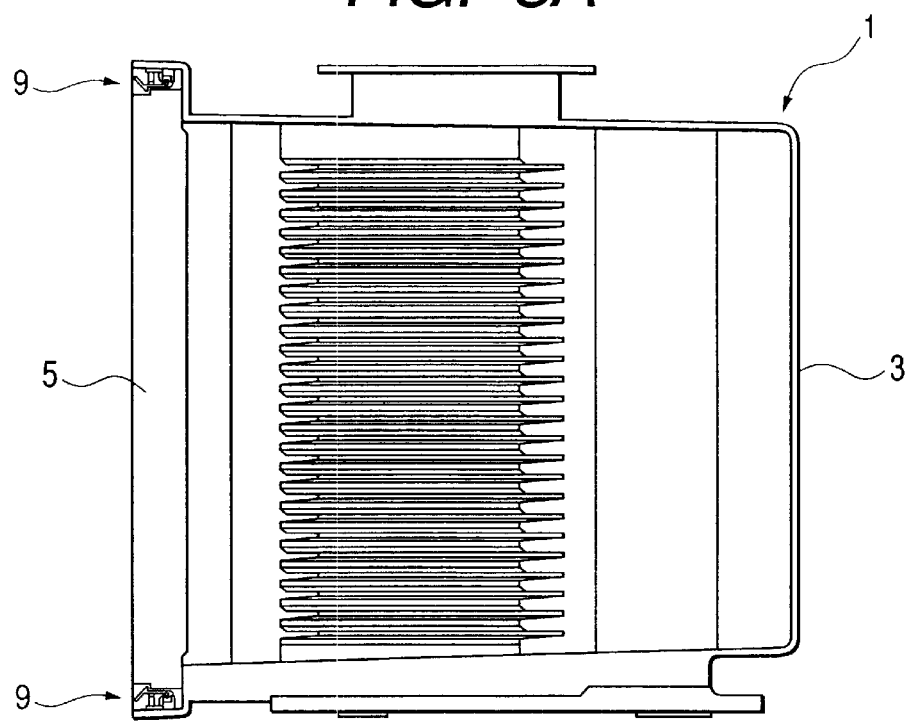
FIGS. 8A and 8B are views of a clean box (side open type) according to another embodiment of the present invention.
Figure 8B:
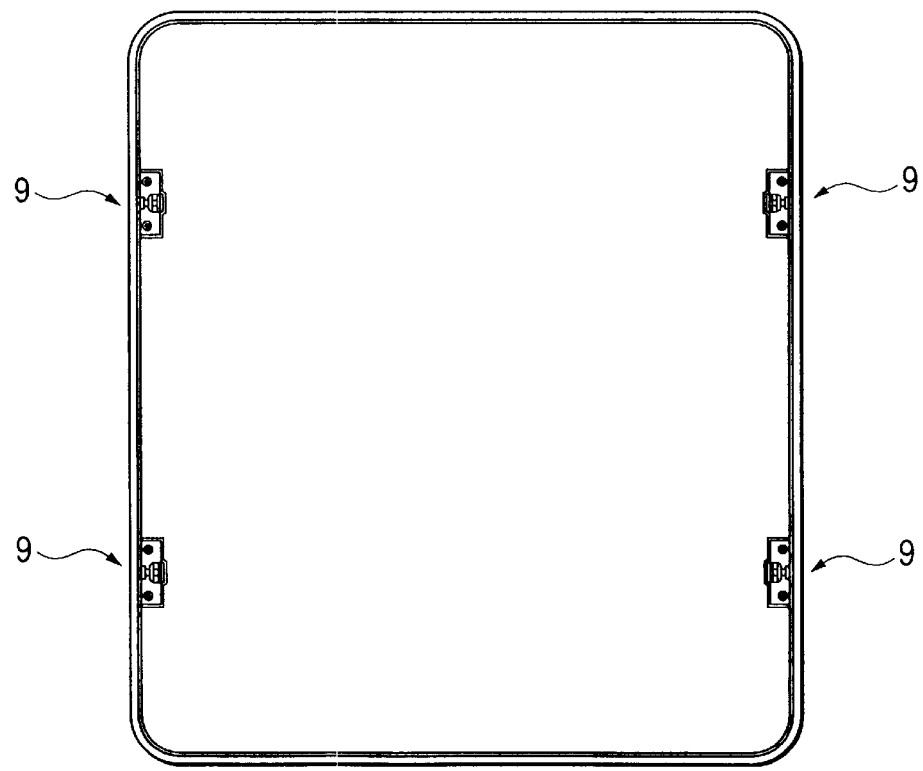

Although the above-described clean box is of a type in which the bottom surface is opened and the article may be taken out from the bottom surface, the present invention is not limited to this specific structure but may be applied to a side open type clean box in which the side surface is opened in a sideway. This type clean box is shown in FIGS. 8A and 8B. FIG. 8A is a side elevational cross-sectional view showing a state in which the clean box is closed by the lid. FIG. 8B is a frontal view of the clean box body as viewed from the opening. Although the opening direction is different from that of the foregoing embodiment, the latch mechanism itself is the same in structure as the clean box in which the bottom surface is opened as shown in FIGS. 3 through 7. The same reference numerals are used to indicate the like parts and components and further explanation therefor will be omitted. Incidentally, although not shown, the clean box shown in FIGS. 8A and 8B also has an annular groove for vacuum suction for surrounding the opening.

Although the above-described clean box according to the embodiment has the four latch mechanisms 9, the number of the latch mechanism is not limited thereto. Actually, if at least one latch mechanism is provided on each of the two opposed sides of the opening of the clean box body, it is possible to prevent the falling-off of the lid.

Also, in the above-described embodiments, the latch member 40 is engaged with the stepped portion 5a formed as a recess in a part of the lid, but the present invention is not limited thereto. For instance, it is possible to mount the portion that engages with the latch member 40 as a discrete member on the lid.

Since the lid latch mechanism for the above-described clean box is very simple in structure, the manufacture thereof is easy and there is almost no breakdown.

Also, with respect to the opening/closing of the latch, it is unnecessary to provide a complicated latch opening/closing mechanism on the side of the load port. It is sufficient to provide a simple projection such as a latch guide 45. By employing this structure and laying the clean box on the load port, it is possible to automatically release the latch and to effect the latch when the clean box is raised.

What is claimed is:

1. A lid latch mechanism for latching a lid of a clean box having a box body opening at one surface and the lid for closing the opening, comprising:
    a latch member that is mounted on the box body and pivotal about a shaft;
    a latch engagement portion provided on the lid for engaging the latch member in its predetermined pivotal position; and
    a biasing member for biasing the latch member toward the latch engagement portion,
    wherein a guide surface is provided on a portion facing the outside of the opening of the box body, of said latch member, and when the clean box is set on a load port, the guide surface is brought into pressingly contact with and pressed by a latch guide provided in the load port so that said latch member pivots to thereby release the latch of the lid.

2. The lid latch mechanism according to claim 1, wherein said guide surface is a slant surface having a slant angle with respect to an outer surface of the lid.

3. The lid latch mechanism according to claim 1, wherein said latch engagement portion is a stepped portion formed in at least a portion of an outer surface of the lid.

4. The lid latch mechanism according to claim 1, wherein said latch mechanism is provided in each of two opposite sides of the opening of the box body.

5. The lid latch mechanism according to claim 1, wherein said clean box has an annular groove formed so as to surround the opening in at least one of the box body and the lid, so that a suction annular space is formed between the box body and the lid in a condition where the lid closes the opening of the box body.

6. A lid latch system for a stationary clean box in a clean transfer system composed of the clean box having a box body opening at one surface and a lid for closing the opening, and a load port for opening the clean box and loading into a clean apparatus an article to be transferred within the clean box, comprising:
    a clean box latch mechanism including, a latch member that is mounted on the box body and pivotal about a shaft,
    a latch engagement portion provided on the lid for engaging said latch member in its predetermined pivotal position, and
    a biasing member for biasing said latch member toward said latch engagement portion; and
    a latch guide mechanism as a projection provided on the load port,
    wherein when the clean box is set on the load port, the latch member is brought into contact with and pressed by said latch guide mechanism so that the latch member pivots to release the latch of the lid.

7. The lid latch system according to claim 6, wherein said guide surface is a slant surface having a slant angle with respect to an outer surface of the lid.

8. The lid latch system according to claim 6, wherein said latch engagement portion is a stepped portion formed in at least a portion of an outer surface of the lid.

9. The lid latch system according to claim 6, wherein said latch mechanism is provided in each of two opposite sides of the opening of the box body.

10. The lid latch system according to claim 6, wherein said clean box has an annular groove formed so as to surround the opening in at least one of the box body and the lid, so that a suction annular space is formed between the box body and the lid in a condition where the lid closes the opening of the box body.

11. The lid latch system according to claim 6, wherein when said clean box is to be removed from said load port, said latch member is biased to thereby automatically latch the lid by said biasing member.

* * * * *